(12) United States Patent
Liu et al.

(10) Patent No.: US 6,492,231 B2
(45) Date of Patent: Dec. 10, 2002

(54) METHOD OF MAKING TRIPLE SELF-ALIGNED SPLIT-GATE NON-VOLATILE MEMORY DEVICE

(75) Inventors: Chun-Mai Liu; Kung-Yen Su, both of San Jose; Kai-Man Chan, Fremont; Albert V. Kordesch, San Jose, all of CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/881,245

(22) Filed: Jun. 8, 2001

(65) Prior Publication Data

US 2002/0022322 A1 Feb. 21, 2002

Related U.S. Application Data

(60) Provisional application No. 60/210,377, filed on Jun. 9, 2000, provisional application No. 60/210,358, filed on Jun. 9, 2000, provisional application No. 60/210,359, filed on Jun. 9, 2000, and provisional application No. 60/211,042, filed on Jun. 12, 2000.

(51) Int. Cl.$^7$ ........................................... H01L 21/8247
(52) U.S. Cl. ........................................ 438/267; 438/596
(58) Field of Search ................................. 438/258, 266, 438/267, 304, 593, 594, 595, 596

(56) References Cited

U.S. PATENT DOCUMENTS

| | | | | |
|---|---|---|---|---|
| 6,107,141 A | * | 8/2000 | Hsu et al. | 438/267 |
| 6,255,691 B1 | * | 7/2001 | Hashimoto | 438/267 |
| 6,323,517 B1 | * | 11/2001 | Park et al. | 438/266 |

FOREIGN PATENT DOCUMENTS

JP          9-237845          *   9/1997

* cited by examiner

*Primary Examiner*—Chandra Chaudhari
(74) *Attorney, Agent, or Firm*—Blakely, Sokoloff, Taylor & Zafman LLP

(57) ABSTRACT

A method for fabricating a triple self-aligned non-volatile memory device is disclosed. The method includes forming isolation oxide on a substrate. A plurality of floating gates are formed by depositing and self-aligning a first polysilicon layer to the isolation oxide. A common source area is then defined on the substrate between the floating gates. A second polysilicon layer is deposited over the common source area and self-aligned with respect to the isolation oxide. A third polysilicon layer is deposited adjacent to the plurality of floating gates. A plurality of select gates are then formed by self-aligning the third polysilicon layer to the isolation oxide. Furthermore, at least one drain area is defined on the substrate.

33 Claims, 13 Drawing Sheets

METHOD OF MAKING TRIPLE SELF-ALIGNED SPLIT-GATE NON-VOLATILE MEMORY DEVICE

CROSS REFERENCE TO RELATED APPLICATIONS

This application claims benefit of the priority of U.S. Provisional Application No. 60/210,377, filed Jun. 9, 2000; U.S. Provisional Application No. 60/210,358, filed Jun. 9, 2000; U.S. Provisional Application No. 60/210,359, filed Jun. 9, 2000; and U.S. Provisional Application No. 60/211,042, filed Jun. 12, 2000.

BACKGROUND

The present invention relates to a non-volatile memory device, and more particularly, to triple self-alignment of gates within such a device.

An electrically erasable programmable memory (EEPROM) cell is a non-volatile writable and erasable memory cell that requires very low operating currents. The unit cell of an EEPROM may be formed by connecting a memory transistor in series with a select transistor. Some EEPROM designs are integrated so that the features of the two transistors are merged. Flash memories describe a family of single-transistor cell EEPROMs. Cell sizes of flash memory are about half that of a two-transistor EEPROM.

Flash memory designs differ in their cell structure based on whether they require one or several transistors per cell. A split-gate flash cell provides the equivalent of a two-transistor architecture, but requires only slightly more semiconductor real estate than a single transistor cell. Flash memory cells may include a floating storage gate interposed between a select gate and the area of the silicon substrate that is the channel of the memory cell transistor. Erasing, writing, or reading of such a cell involves injecting or removing electrons to or from the floating gate. Applying different combinations of voltages on its control gate, source, drain, and substrate controls this erasing, writing and reading of the cell.

For a split-gate flash memory to operate properly, it may be necessary for the select gate to at least cover the distance between the drain region (or source region) and the floating gate. If this distance is not constant, the length of the select gate may need to overcompensate for the variance in distance to ensure that the split-gate flash memory operates properly. Furthermore due to the overcompensation in the select gate length, a non-self-aligned split gate process deters cell size scaling. Moreover, cell characteristics, such as program efficiency and cell current, are severely affected by misalignment, which may occur in a non-self-aligned gate process.

SUMMARY

In one aspect, the present invention describes a method for fabricating a triple self-aligned non-volatile memory device. The method includes forming isolation oxide on a substrate. A plurality of floating gates are formed by depositing and self-aligning a first polysilicon layer to the isolation oxide. A common source area is then defined on the substrate between the floating gates. A second polysilicon layer is deposited over the common source area and self-aligned with respect to the isolation oxide. A third polysilicon layer is deposited adjacent to the plurality of floating gates. A plurality of select gates are then formed by self-aligning the third polysilicon layer to the isolation oxide. Furthermore, at least one drain area is defined on the substrate.

In another aspect, the invention describes a triple self-aligned non-volatile memory device. The device includes an isolation oxide, a plurality of floating gates, a common source area, a plurality of select gates, and a contact. The floating gates, having a first polysilicon layer, are self-aligned to the isolation oxide. A second polysilicon layer is formed on top of the common source area between the floating gates. The second polysilicon layer is also self-aligned to the isolation oxide. The select gates are provided adjacent to the floating gates. Further, the select gates are self-aligned to the isolation oxide. A contact provides connection to a drain region.

BRIEF DESCRIPTION OF THE DRAWINGS

FIG. 3 shows one embodiment of a substrate subjected to a shallow trench isolation (STI) process to form an oxide layer on top surface of the substrate.

FIG. 4 shows a sacrificial polycrystalline layer deposited over the oxide layer.

FIG. 5 shows a controlled polycrystalline etching performed to define the floating gate area.

FIG. 6 shows a photoresistive masking layer which substantially defines a common source area of the substrate.

FIG. 7 shows a common source polycrystalline silicon line formed over the common source area.

FIG. 8 shows a top oxide layer used as a hard mask to remove an amorphous polycrystalline layer and a floating gate poly.

FIG. 9 shows polycrystalline select gates formed on either side of the floating gates.

FIG. 10 shows entire wafer shifted to prepare the cell for peripheral devices.

FIG. 11 shows a thin oxide layer and a drain regions formed on the substrate.

FIG. 12 shows a Cobalt layer deposited on top of the structure of FIG. 11 to form Cobalt salicide.

FIG. 13 illustrates a plan view of the flash memory array in accordance with an embodiment of the present invention.

DETAILED DESCRIPTION

In recognition of the above-described difficulties with a non-self-aligned split-gate process, the present invention describes embodiments for a triple self-aligned split-gate process. The position and length of the floating/select gate and their positions relative to that of the field isolation oxide region are "self-aligned" (automatically aligned with respect to each other) in accordance with an embodiment of the present invention. Furthermore, the common source polycrystalline may also be self-aligned. The self-alignment occurs because the positions are determined by the same photomask. This automatic self-alignment facilitates shrinkage of the cell in the memory device. Consequently for purposes of illustration and not for purposes of limitation, the exemplary embodiments of the invention are described in a manner consistent with such use, though clearly the invention is not so limited.

Figure 1:
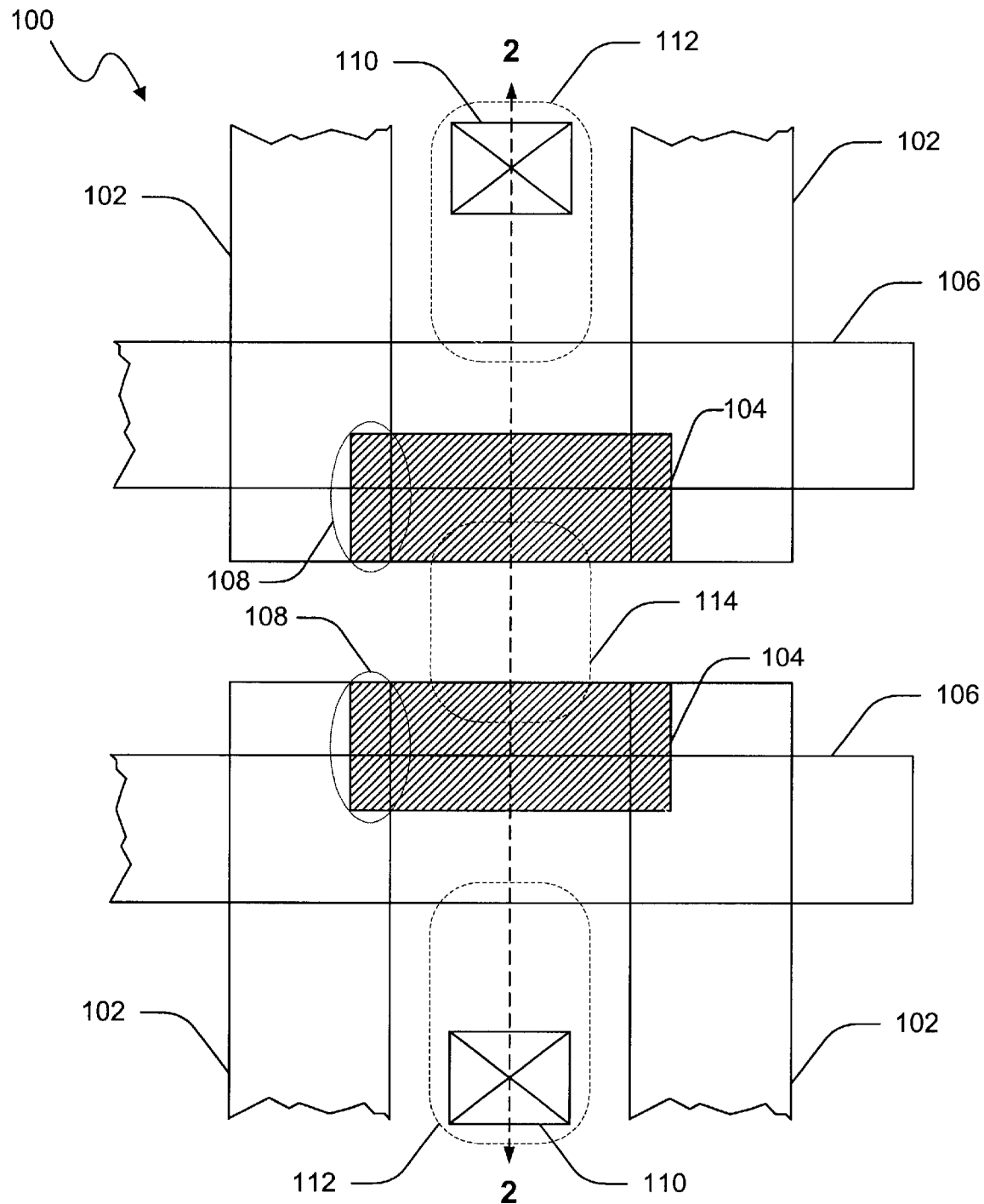
FIG. 1 illustrates a plan view of a conventional split-gate flash memory device.
Figure 2:
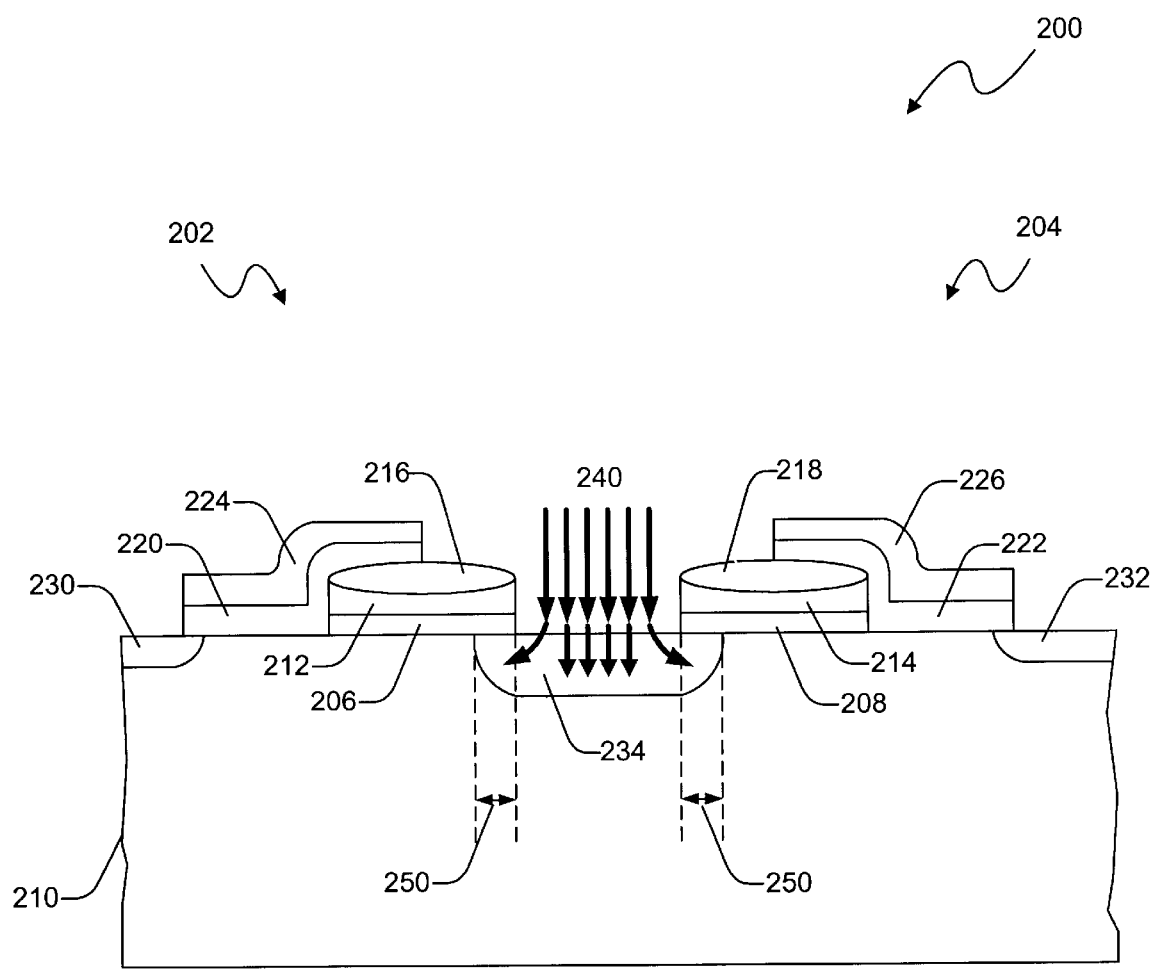
FIG. 2 illustrates a cross sectional view of a conventional split-gate flash memory device.

FIGS. 1 and 2 illustrate simplified diagrams of a conventional split-gate flash memory device 100, 200. As shown, the diagrams include a plan view (FIG. 1) and a cross-sectional view (FIG. 2) of the conventional split-gate flash memory device 100, 200. The plan-view diagram of FIG. 1 shows field isolation oxide or shallow trench isolation (STI) regions 102. The STI regions 102 separate and/or isolate one cell region from another cell region in the active device region. A flash memory device 100, 200 is defined between the STI regions 102. The flash memory device 100, 200 includes a variety of features, such as a floating gate 104 that is defined between and overlaps a portion of the STI regions 102. A control (or select) gate 106 is defined overlying a portion of the floating gate 104. The gate 106 also overlies portions 108 of the STI regions 102. Contacts 110 to drain regions 112 are also shown. An area between the floating gates 104 may define a common source region 114.

FIG. 2 shows a cross sectional view of the conventional split-gate flash memory device 200, viewed along the line designated 2—2 in FIG. 1. The memory device 200 includes first and second memory cells, at 202 and 204. The memory device 200 may be manufactured in accordance with a conventional semiconductor fabrication process. The process includes forming a tunneling oxide layer 206, 208 over a substrate 210, and forming a first polysilicon layer 212, 214 over the tunneling oxide layer 206, 208. A floating gate oxide layer 216, 218 may be formed over portions of the first polysilicon layer 212, 214. Portions of the first polysilicon layer 212, 214 and tunneling oxide layer 206, 208 are then removed by an etching process using the floating gate oxide layer 216, 218 as a mask. This exposes portions of the substrate 210, and forms first and second floating gates 212, 214 from the remaining portions of the first polysilicon layer. An insulating layer 220, 222 may be formed over the exposed portions of the substrate 210, over the floating gates 212, 214, and over the floating gate oxide layer 216, 218. A conductive layer 224, 226 may then be deposited over the insulating layer 220, 222. A patterning and etching process is performed to remove portions of the insulating layer 220, 222 and portions of the conductive layer 224, 226. This process exposes portions of the substrate 210, and forms first and second select gates 224, 226 from remaining portions of the conductive layer. Drain regions 230, 232 may be formed by performing a gas deposition process to dope portions of substrate 210.

A common source region 234 may be formed in accordance with a gas deposition process illustrated at 240. The process includes depositing ions into the exposed portion of the substrate 210 between the floating gates 212, 214. Typically phosphorous ions are deposited to form the common source region 234. During the deposition process, ions diffuse downward into the substrate 210 and laterally to extend outward from the exposed portion of the substrate 210 to areas of the substrate disposed beneath floating gates 212, 214. This lateral diffusion of ions is referred to as source side injection process. For gas diffusion, the distance that the side diffusion can extend laterally may be limited to approximately 70% of the diffusion depth, which is the distance that ions may be diffused downward into the substrate. Because the diffusion depth is limited, the side diffusion of ions beneath the floating gates 212, 214 may also be limited to distance shown at 250.

Referring to FIG. 1, the floating gate 104 may be made using conventional patterning techniques that form the floating gate structure. The structure overlaps portions 108 of STI regions 102. Thus, the conventional floating gate (poly-1) 104 is not self-aligned to the STI region 102, which may produce a first misalignment. Moreover, the conventional control (or select) gate (poly-2) 106 is also not self-aligned to the STI region 102, which may produce a second misalignment. Further, the conventional contact 110 is not self-aligned to the STI regions 102, resulting in a third misalignment. These three misalignments may result in larger cell sizes.

Accordingly, FIGS. 3 through 12 show cross-sectional views generally illustrating a fabrication process for a triple self-aligned split-gate flash memory device in accordance with an embodiment of the present invention.

Figure 3:
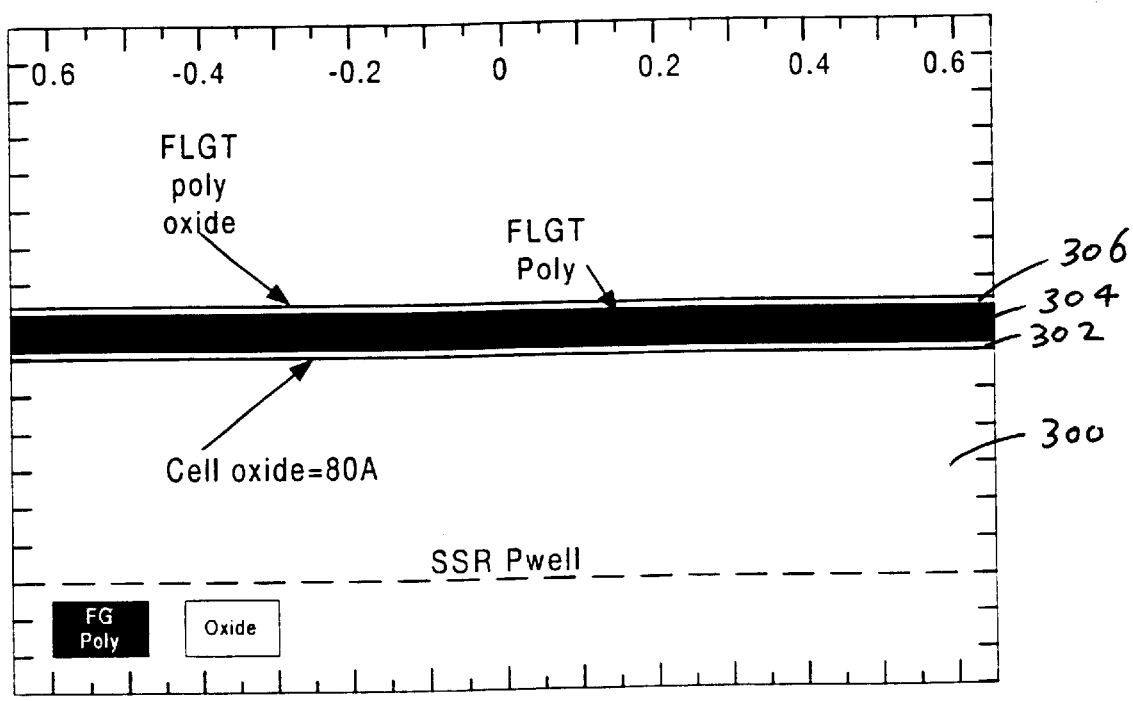
FIGS. 3 through 13 generally illustrate a fabrication process for a triple self-aligned split-gate flash memory device in accordance with an embodiment of the present invention.

FIG. 3 shows a substrate 300 subjected to a shallow trench isolation (STI) process to form an oxide layer 302 on the top surface of the substrate 300. In one embodiment, the substrate includes a semiconductor such as silicon. The substrate 300 may be either a p-type or n-type semiconductor material. In the illustrated embodiment, the oxide layer 302 has a thickness in the range of about 60 to 120 angstroms. Moreover, the oxide layer 302 may be a thin oxide through which a cell may be programmed (electrons forced onto the floating gate). A polycrystalline layer 304, such as polysilicon layer, may then be deposited with a thickness in the range of about 1000 to 3000 angstroms. The layer 304 may also be doped with an impurity, such as phosphorus ions. In one embodiment, the layer 304 includes ions implanted at a concentration of about $1 \times 10^{19}/cm^3$. Another oxide layer 306 with a thickness of about 300 to 1000 angstroms may be added to the top of the poly layer 304. Thus, the oxide layer 306 may be used as a mask to control where oxide will grow in subsequent steps.

Figure 4:
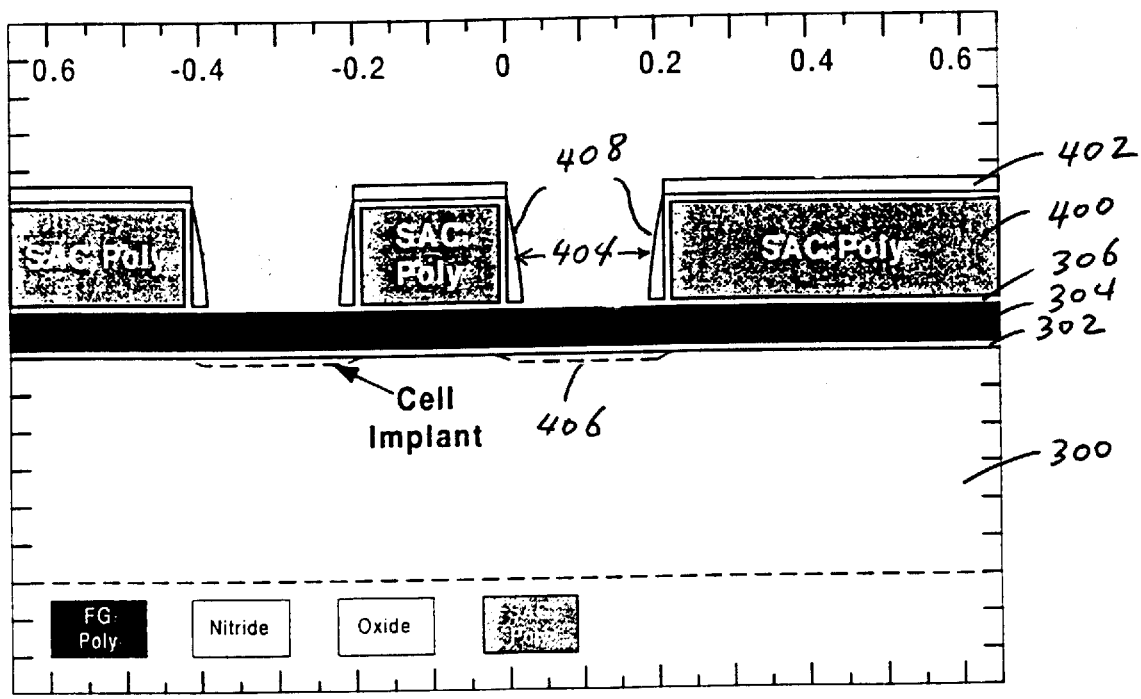

FIG. 4 shows a sacrificial polycrystalline layer 400 having a thickness of about 1500 to 4000 angstroms deposited over the oxide layer 306. Another oxide layer 402 with a thickness in the range of about 300 to 800 angstroms may be deposited on top of the polycrystalline layer 400. Photomasking may be applied to define a floating gate area 404 after receiving the traditional plasma etching to remove the unmasked oxide layer 402 and the polycrystalline layer 400.

An ion implant may be performed to give the necessary substrate concentration at the flash cell channel area 406. In one embodiment, the ion includes boron ($B^+$). The energy dose for this implant may be in the range of about 150 to 200 KeV, with a doping density in the approximate range of $1 \times 10^{12}/cm^2$ to $5 \times 10^{12}/cm^2$. A nitride layer with a thickness in the range of approximately 300 to 800 angstroms may then be deposited. Deposition of the nitride layer may be followed by a plasma etching process to perform the blanket etching back. This leaves a nitride spacer layer 408, as shown.

Figure 5:
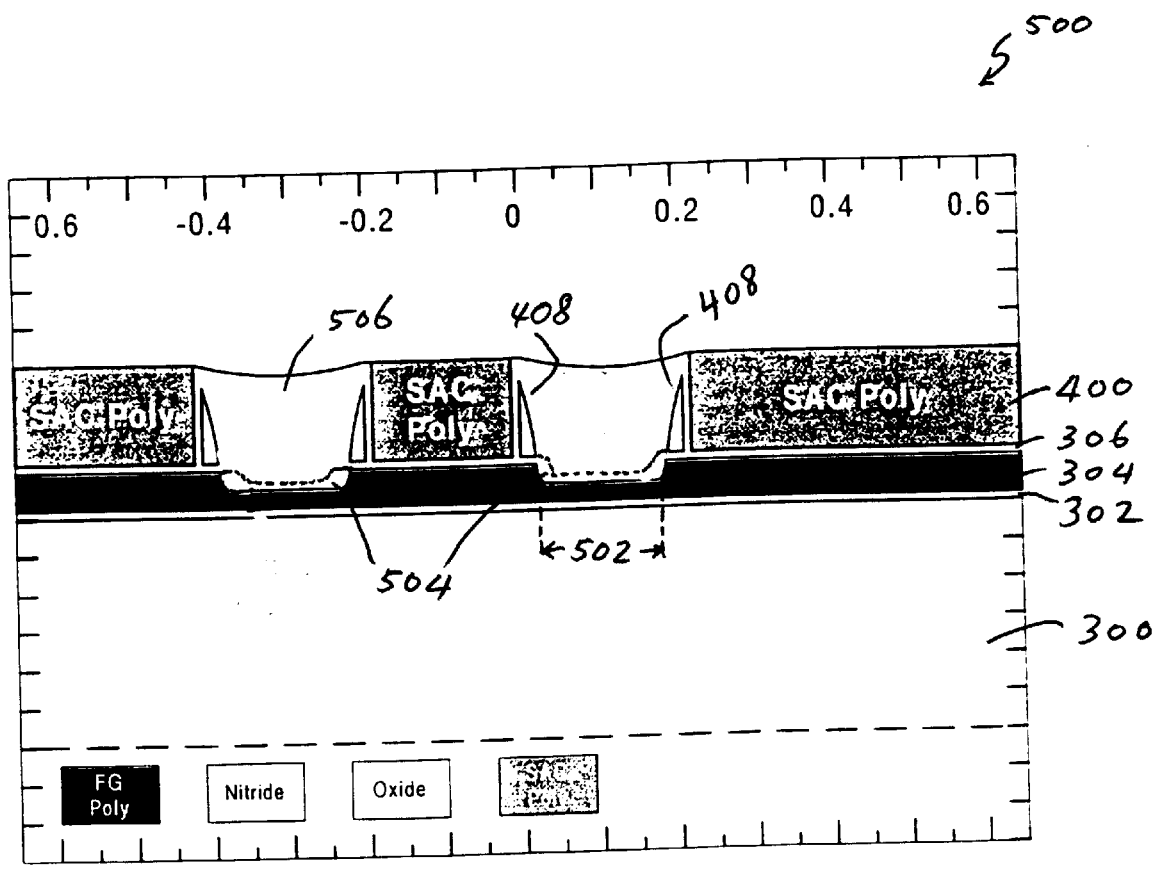

Referring to FIG. 5, in one embodiment, a controlled polycrystalline etching is performed to define the floating gate area 502. A thermal oxide layer 504 having a thickness of about 60 to 120 angstroms may be grown at a temperature ranging between about 800 and 950° C. An oxide layer 506 with a thickness ranging between about 4000 and 6000 angstroms may be deposited. A planar etch back may then be performed to create the structure 500 as shown in FIG. 5.

Figure 6:
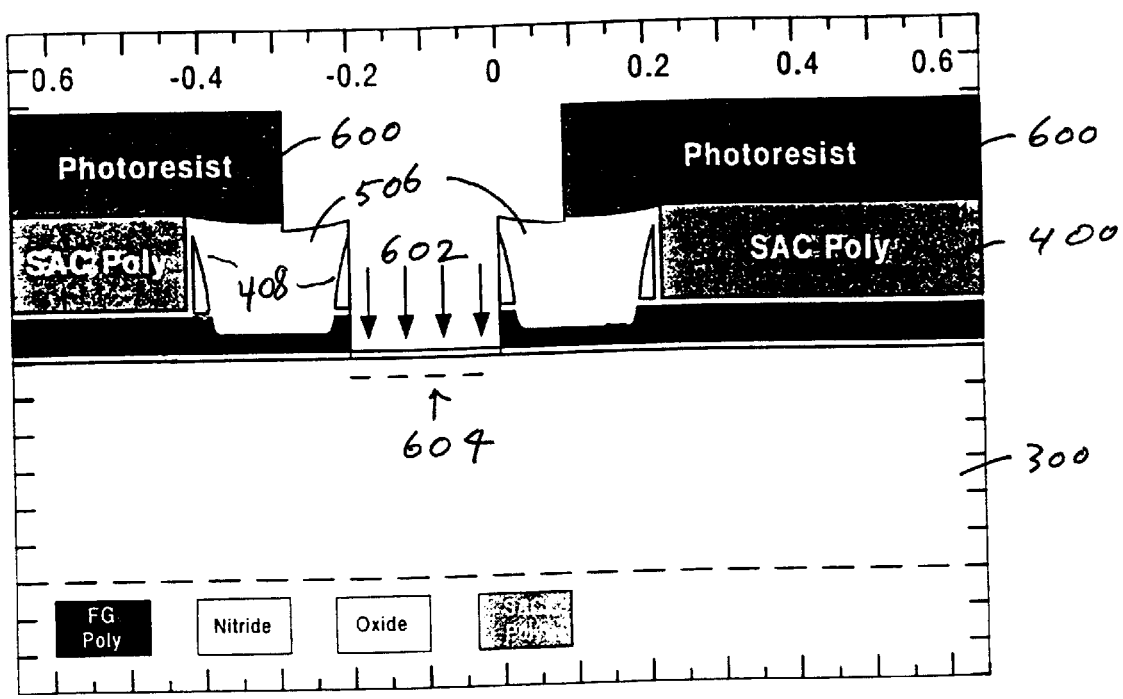

In the illustrated embodiment of FIG. 6, a photoresistive masking layer 600 is formed over the planar oxide layer 506. The masking layer 600 substantially defines the common source area 604 of the substrate. An ion implantation may then be performed to implant ions 602 into the source region 604 using the masking layer 600 as a mask. In one embodiment, the implant may include two implant species. The first specie may include an arsenic ($As^+$) ion implant with energy ranging from about 50 to 100 KeV. The implant dose may range from about $2\times10^{15}/cm^2$ to $8\times10^{15}/cm^2$. The second implant specie may include a phosphorous ($P^{30}$) ion implant with energy ranging from about 40 to 80 KeV. The implant dose may range from about $1\times10^{15}/cm^2$ to $6\times10^{15}/cm^2$. After the implant process is completed, the photoresistive layer 600 may be removed using wet strip or dry plasma clean.

Figure 7:
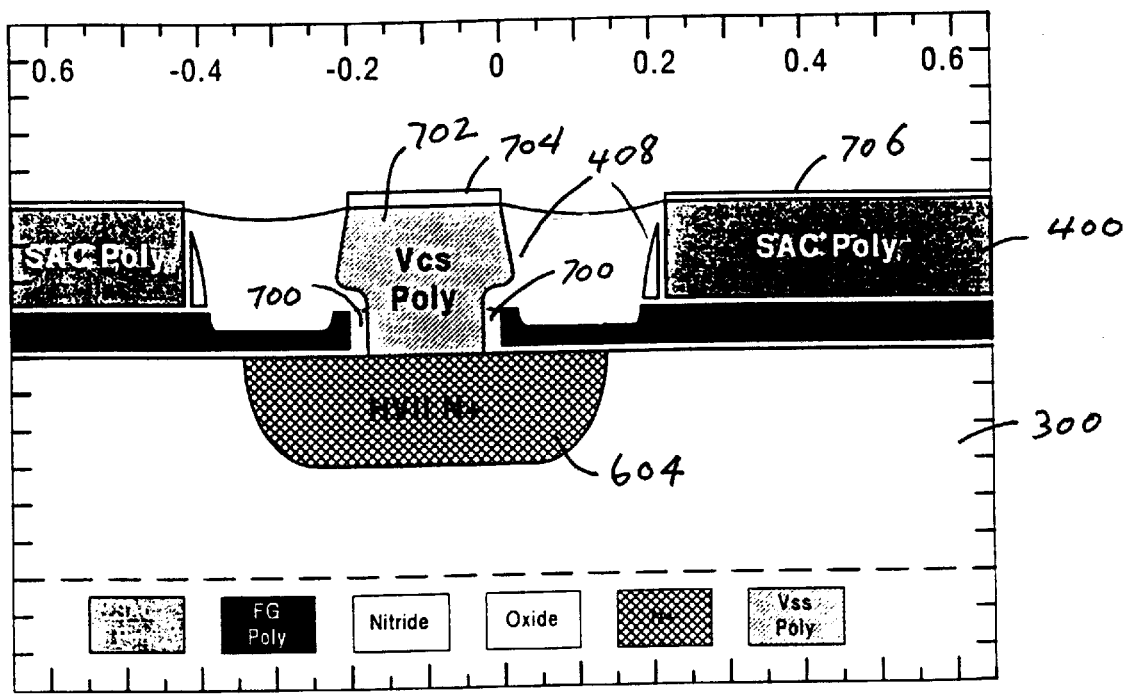

As illustrated in FIG. 7, the nitride spacer 408 (see FIG. 6) at the common source area may be stripped away using traditional wet method. A layer of oxide with a thickness of about 1500 to 3500 angstroms may then be deposited and etched back. The etching back may use a traditional dry method. Therefore, the etching back leaves a thin layer 700 of oxide spacer. A polycrystalline layer of a thickness ranging from about 2000 to 4000 angstroms may then be deposited and doped using either furnace or ion implantation. This may be followed by another planar etching back to form the common source polycrystalline silicon line 702. A thermal furnace process may be performed to grow oxide 704 on top of the common source polycrystalline layer 702. Oxide 706 may also be grown on top of the amorphous polycrystalline layer 400. Due to crystal structure and doping concentration differences, the thickness of these oxide layers 704, 706 may be different.

Figure 8:
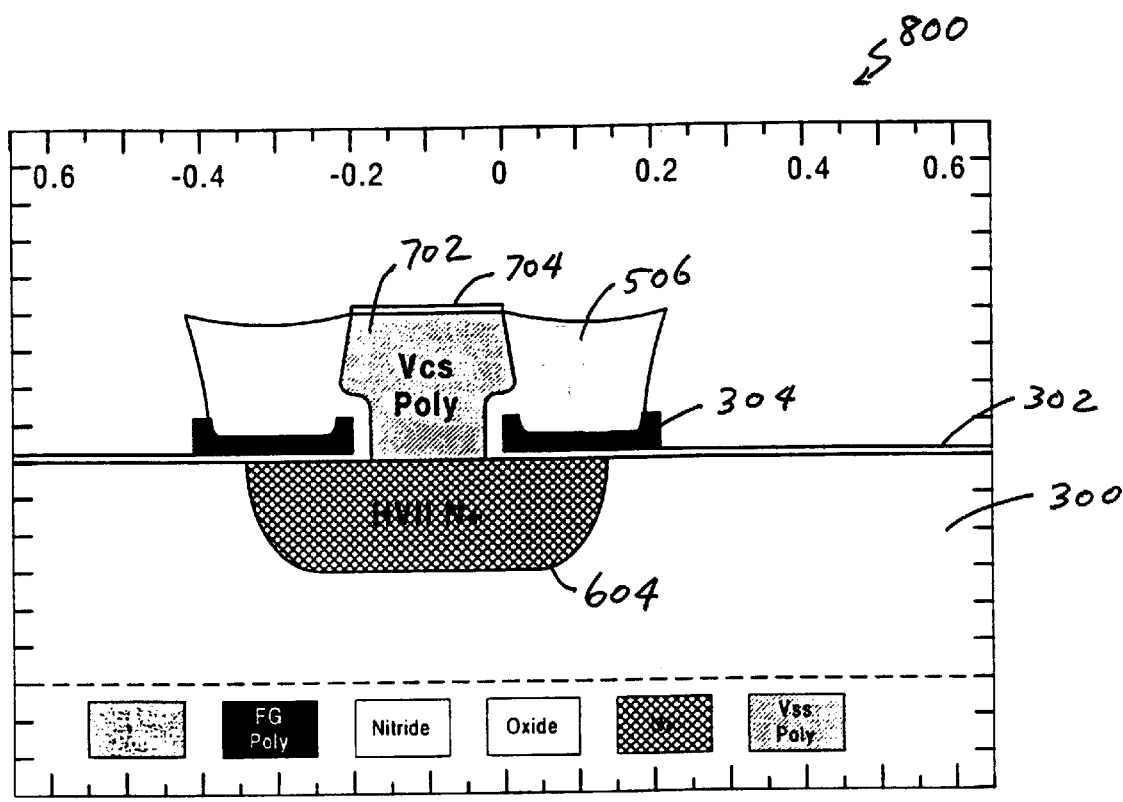

A controlled etch is then performed to remove the oxide layer 706 (shown in FIG. 7). Substantial portion of the oxide layer 704 may still remain. The oxide layer 704 may be used as a hard mask when a series of etching steps is performed to remove the amorphous polycrystalline layer 400, the oxide layer 306, and the floating gate poly 304 (see FIG. 7). In one embodiment, the nitride spacer layer 408 may be removed using the wet method. A poly edge clean may be performed to form the structure 800 as shown in FIG. 8.

Figure 9:
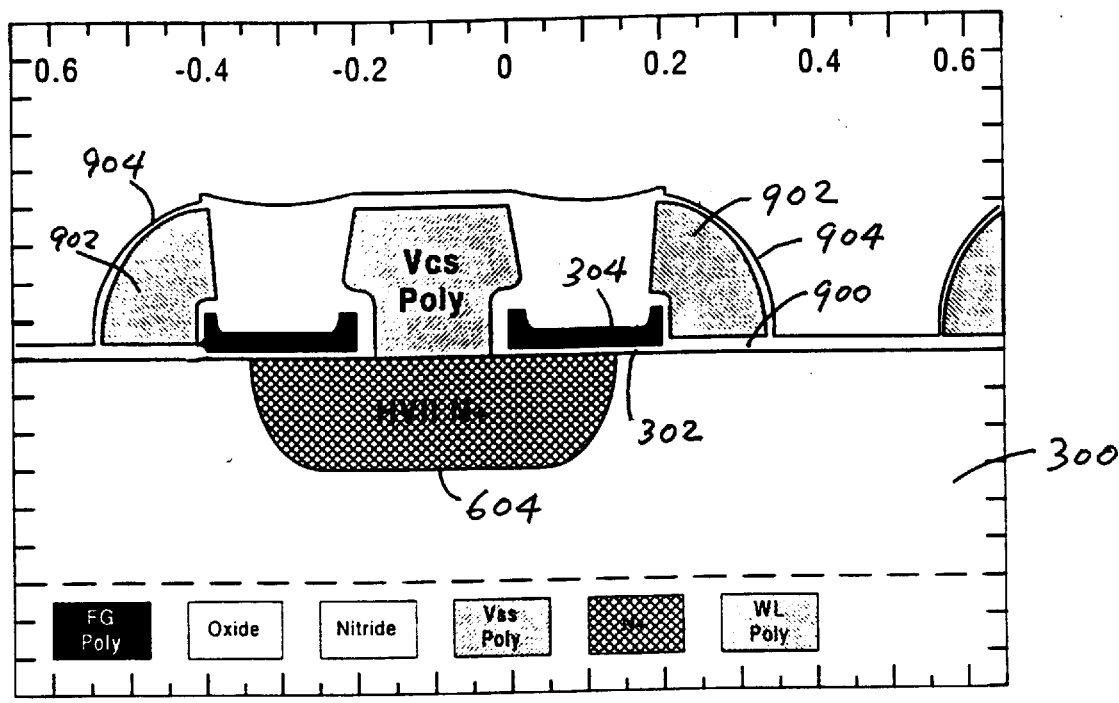

Referring to FIG. 9, a thermal furnace process may be performed to provide a growth of an oxide layer 900. The thickness of this oxide layer 900 may range from about 120 to 300 angstroms. A polycrystalline silicon layer may then be deposited with a thickness of about 2000 to 4000 angstroms. Furthermore, polycrystalline silicon etch back may be performed to form a polycrystalline spacer layer 902. In the illustrated embodiment, the thermal furnace process grows an oxide layer 904 with a thickness ranging from about 100 to 300 angstroms. In the illustrated embodiment, the polycrystalline spacer layer 902 forms a select gate.

Figure 10:
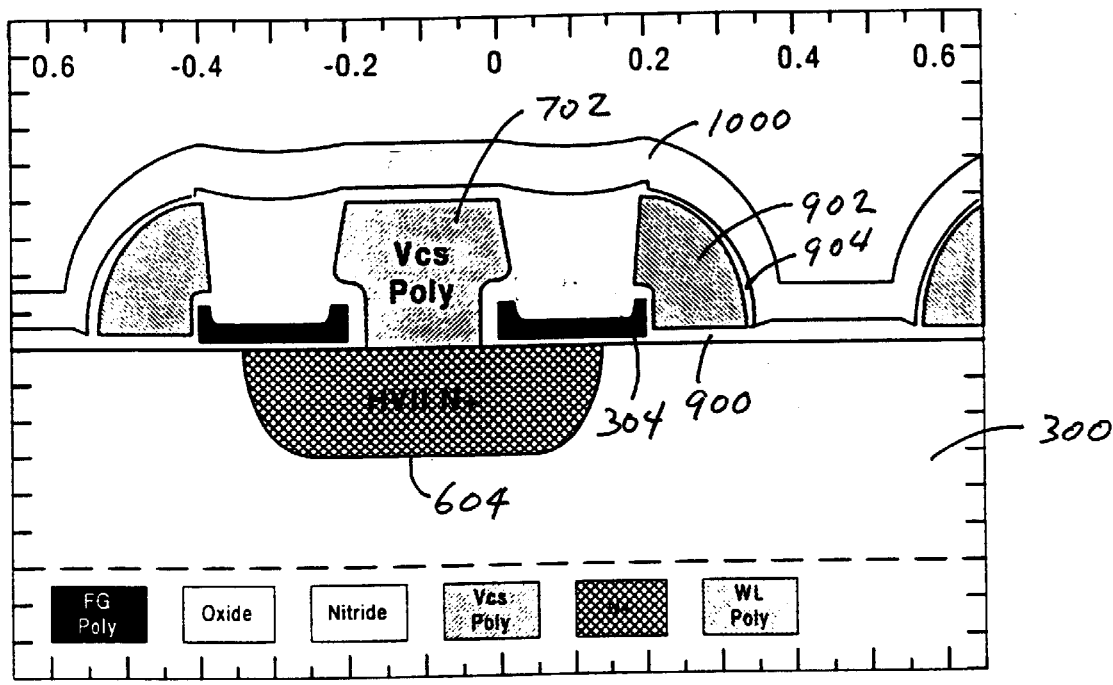

In FIG. 10, the entire wafer may be shifted to prepare the cell for the peripheral devices. Various conventional masks and process steps may be used for the preparation. A gate poly layer 1000 may then be deposited with an average thickness of about 1500 to 3500 angstroms.

Figure 11:
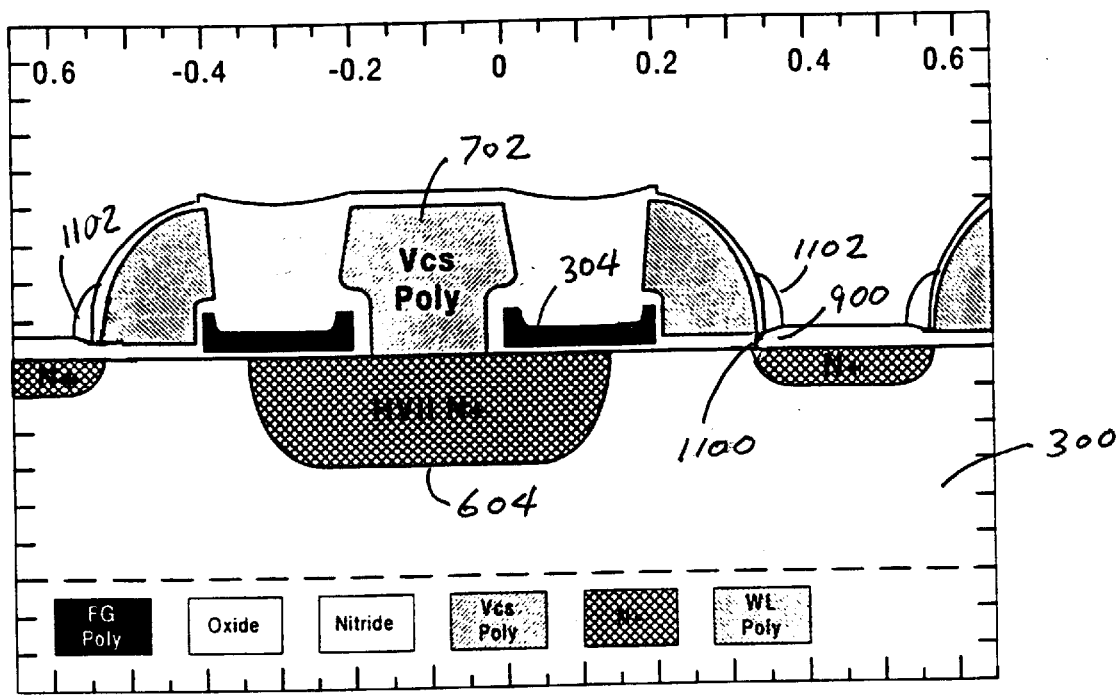

FIG. 11 shows a thin oxide layer with a thickness of about 200 to 500 angstroms. The thin oxide layer is deposited on top of the previous oxide layer 900. The thin oxide layer may then be etched back to form a small oxide spacer 1100. Furthermore, a nitride layer with a thickness of about 1200 to 2400 angstroms may be deposited over the oxide spacer 1100 in an open area 1104 opposite the common source region 604. The nitride layer may then be etched back to form a thin nitride spacer 1102. The open area 1104 may be ion implanted with impurity to form a drain region 1106.

Figure 12:
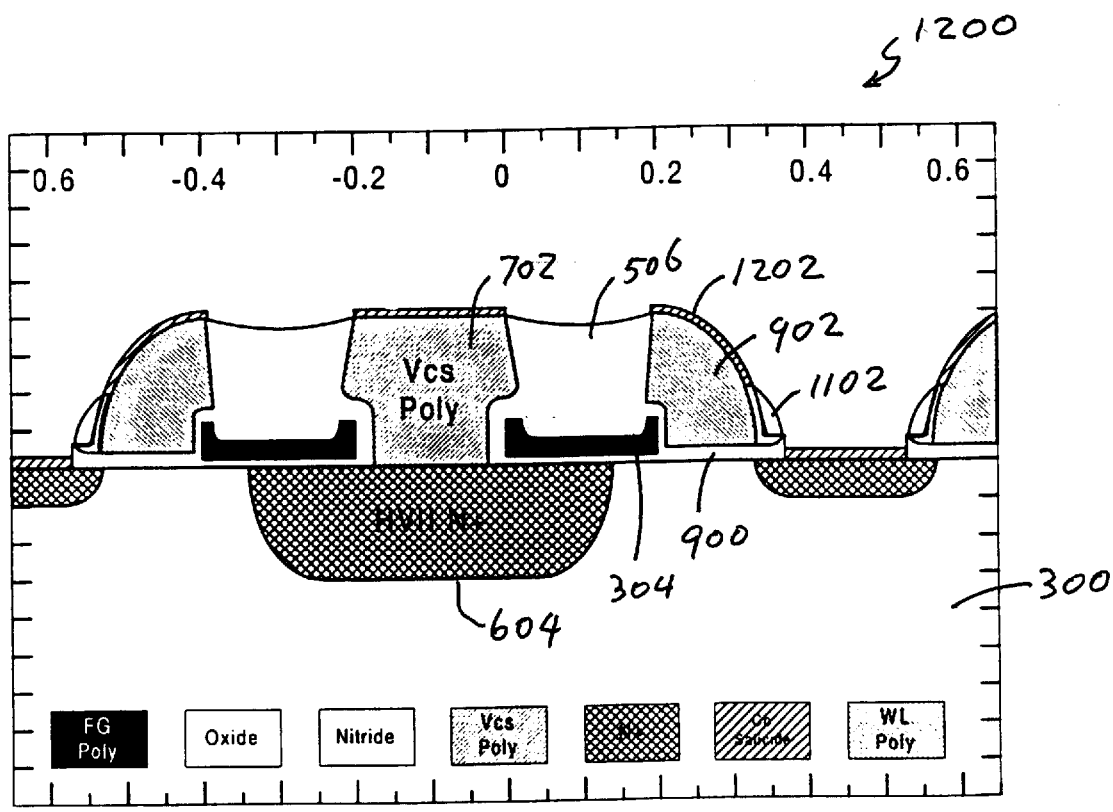

In the illustrated embodiment of FIG. 12, a Cobalt layer 250 having a thickness of about 400 to 2000 angstroms may be deposited on top of the structure of FIG. 11 to form Cobalt salicide. Accordingly, the structure of FIG. 12 forms one embodiment of the triple self-aligned split-gate flash memory device of the present invention. Further, the process described in conjunction with FIGS. 3 through 12 illustrates the self-alignment technique.

Figure 13:
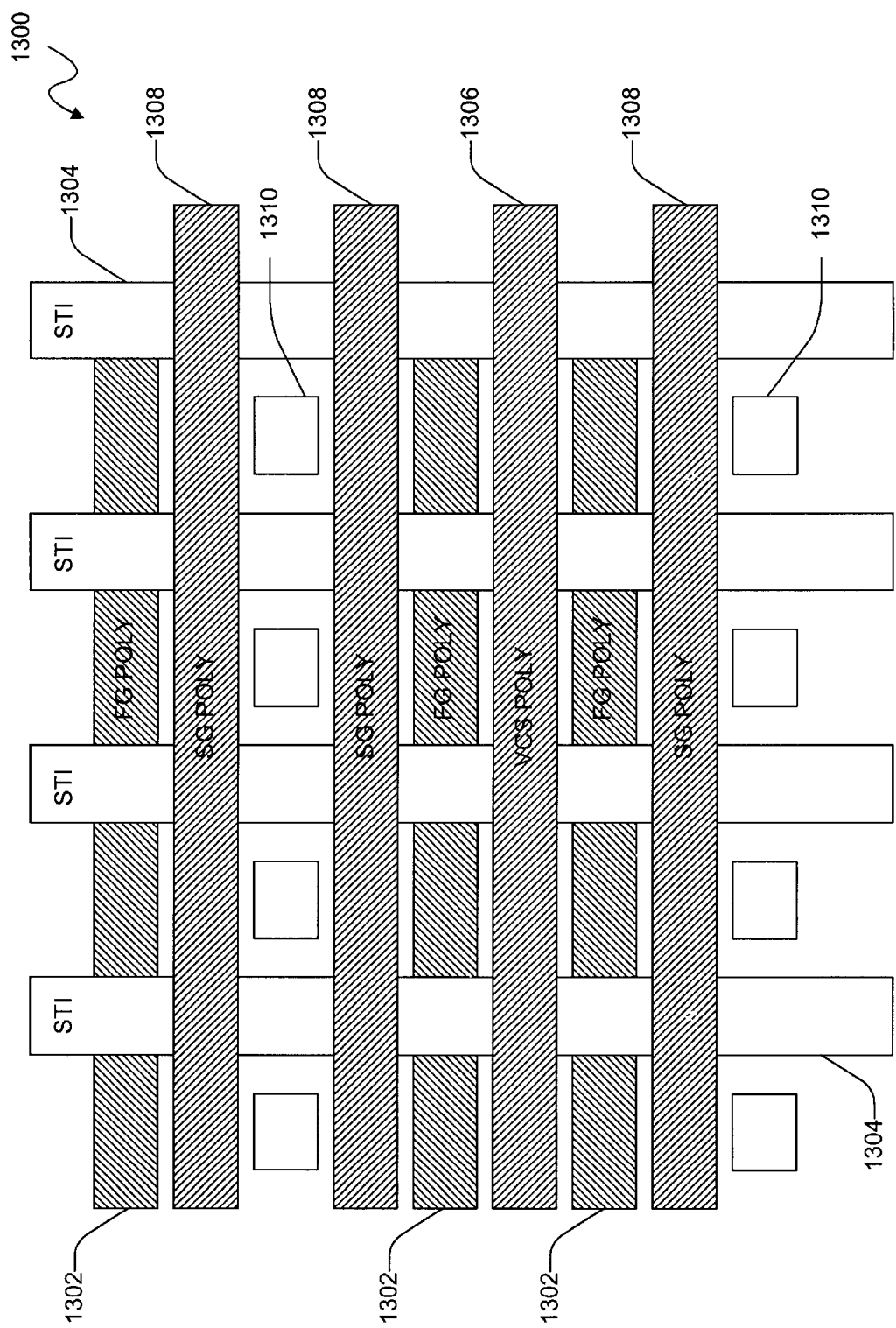

FIG. 13 illustrates a plan view of the flash memory array 1300. In the illustrated embodiment, the array 1300 is laid out such that the floating gate polycrystalline silicon 1302 is self-aligned to the shallow trench isolation (STI) region 1304. Moreover, the common source polycrystalline silicon 1306 is also self-aligned to the STI region 1304. Further, the select gate polycrystalline silicon 1308 is self-aligned to the STI region 1304. Finally, the contacts 1310 may be self-aligned to the STI region 1304 as well.

There has been disclosed herein embodiments for fabrication of a triple self-aligned split-gate flash memory device. The illustrated embodiments show self-alignment techniques for forming gates and contacts in such a device. This self-alignment facilitates shrinkage of the cell in the memory device. In summary, three poly layers 1302, 1306, 1308 are all self-aligned to the STI region 1304.

While specific embodiments of the invention have been illustrated and described, such descriptions have been for purposes of illustration only and not by way of limitation. Accordingly, throughout this detailed description, for the purposes of explanation, numerous specific details were set forth in order to provide a thorough understanding of the present invention. It will be apparent, however, to one skilled in the art that the system and method may be practiced without some of these specific details. For example, exact steps of fabricating the memory device may vary, or may be replaced with other related known steps. Further, the invention may be practiced with ranges of layer thickness that are different from the quoted example ranges. In other instances, well-known structures and functions were not described in elaborate detail in order to avoid obscuring the subject matter of the present invention. Accordingly, the scope and spirit of the invention should be judged in terms of the claims which follow.

What is claimed is:

1. A method for fabricating a triple self-aligned non-volatile memory device on a substrate, comprising:

first forming isolation oxide over the substrate;

second forming a plurality of floating gates by first depositing and self-aligning the first polysilicon layer to the isolation oxide;

first defining a common source area on the substrate between said plurality of floating gates;

second depositing a second polysilicon layer over the common source area, and self-aligning the second polysilicon layer with respect to the isolation oxide;

third depositing a third polysilicon layer adjacent to the plurality of floating gates;

third forming a plurality of select gates by self-aligning the third polysilicon layer to the isolation oxide; and second defining at least one drain area on the substrate.

2. The method of claim 1, wherein the substrate includes silicon.

3. The method of claim 1, wherein the non-volatile memory includes a flash memory device.

4. The method of claim 1, wherein the isolation oxide includes a shallow trench isolation oxide.

5. The method of claim 1, wherein the isolation oxide has a thickness in a range between about 60 and 120 angstroms.

6. The method of claim 1, wherein the first polysilicon layer has a thickness in a range between about 1000 and 3000 angstroms.

7. The method of claim 1, wherein said second forming a plurality of floating gates includes doping the first polysilicon layer with an impurity.

8. The method of claim 7, wherein said impurity includes phosphorous ions.

9. The method of claim 7, wherein the first polysilicon layer is ion implanted with said impurity at a concentration of about $1 \times 10^{19}/cm^3$.

10. The method of claim 1, wherein said second forming a plurality of floating gates includes:

depositing a first oxide layer over the first polysilicon layer;

depositing a sacrificial polycrystalline layer over the first oxide layer;

depositing a second oxide layer on top of the sacrificial polycrystalline layer;

photomasking the second oxide layer; and etching the second oxide layer and the sacrificial polycrystalline layer to remove an unmasked area.

11. The method of claim 10, wherein said second forming a plurality of floating gates also includes:

depositing a nitride layer over the plurality of floating gates; and plasma etching the nitride layer to form a spacer.

12. The method of claim 11, wherein a thickness of the nitride layer ranges from about 300 to 800 angstroms.

13. The method of claim 11, wherein said second forming a plurality of floating gates further includes:

etching the first polysilicon layer to define areas for the plurality of floating gates;

growing a thermal oxide layer over the defined areas for the plurality of floating gates;

depositing a third oxide layer over the thermal oxide layer; and planar etching to produce said third oxide layer that is level with top surface of the sacrificial polycrystalline layer.

14. The method of claim 13, wherein the thermal oxide layer has a thickness of about 60 to 120 angstroms.

15. The method of claim 1, further comprising:

implanting ions at a flash cell channel area after said second forming a plurality of floating gates.

16. The method of claim 15, wherein said ions includes boron ions.

17. The method of claim 15, wherein an energy dose of said implanting ions ranges from about 150 to 200 KeV.

18. The method of claim 11, wherein doping density of said implanting ions ranges from about $1 \times 10^{12}/cm^2$ to $5 \times 10^{12}/cm^2$.

19. The method of claim 13, further comprising:

forming a photoresistive masking layer over the third oxide layer and the sacrificial polycrystalline layer.

20. The method of claim 19, further comprising:

implanting ions into the common source area using the photoresistive masking layer as a mask.

21. The method of claim 20, wherein said implanting ions includes implanting arsenic ions.

22. The method of claim 21, wherein an energy dose of said implanting arsenic ions ranges from about 50 to 100 KeV.

23. The method of claim 21, wherein doping density of said implanting arsenic ions ranges from about $2 \times 10^{15}/cm^2$ to $8 \times 10^{15}/cm^2$.

24. The method of claim 21, further comprising:

implanting phosphorous ions.

25. The method of claim 24, wherein an energy dose of said implanting phosphorous ions ranges from about 40 to 80 KeV.

26. The method of claim 24, wherein doping density of said implanting arsenic ions ranges from about $1 \times 10^{15}/cm^2$ to $6 \times 10^{15}/cm^2$.

27. The method of claim 1, wherein said third polysilicon layer has thickness ranging from about 2000 to 4000 angstroms.

28. The method of claim 1, further comprising:

doping said second polysilicon layer.

29. The method of claim 28, further comprising:

planar etching said second polysilicon layer; and growing oxide layer on top of said second polysilicon layer.

30. The method of claim 1, wherein said third forming a plurality of select gates includes:

growing a first oxide layer on the substrate adjacent to said plurality of floating gates;

depositing a polycrystalline layer over the first oxide layer;

etching back said polycrystalline layer to form a polycrystalline spacer; and depositing a second oxide layer over said polycrystalline layer.

31. The method of claim 30, wherein said first oxide layer has a thickness ranging from about 120 to 300 angstroms.

32. The method of claim 30, wherein sad polycrystalline layer has a thickness of about 2000 to 4000 angstroms.

33. The method of claim 30, further comprising:

depositing a Cobalt layer on top of the second oxide layer to form Cobalt salicide.

* * * * *